United States Patent [19]

Sawase et al.

[11] Patent Number: 5,420,444
[45] Date of Patent: * May 30, 1995

[54] LIGHT EMITTING DIODE AND LIGHT EMITTING DIODE ARRAY HAVING UNIFORM LIGHT DISTRIBUTION

[75] Inventors: Kensuke Sawase; Hiromi Ogata, both of Kyoto, Japan

[73] Assignee: Rohm Co., Ltd., Kyoto, Japan

[*] Notice: The portion of the term of this patent subsequent to Oct. 5, 2010 has been disclaimed.

[21] Appl. No.: 77,876

[22] Filed: Jun. 18, 1993

Related U.S. Application Data

[63] Continuation of Ser. No. 828,141, Jan. 30, 1992, Pat. No. 5,250,820.

[30] Foreign Application Priority Data

Jan. 30, 1991 [JP] Japan .................. 3-9202 U

[51] Int. Cl.⁶ .............. H01L 33/00; H01L 29/78; H01L 31/00
[52] U.S. Cl. .......................... 257/99; 257/98; 257/465
[58] Field of Search ............... 257/98, 99, 465, 773; 346/110 R

[56] References Cited

U.S. PATENT DOCUMENTS

| | | | |
|---|---|---|---|
| 4,375,686 | 3/1983 | de Waard | 372/45 |
| 4,633,280 | 12/1986 | Takasu | 357/17 |
| 4,721,977 | 1/1988 | Fukae | 355/3 R |
| 4,722,089 | 1/1988 | Botez et al. | 372/50 |
| 4,792,959 | 12/1988 | Mueller et al. | 372/46 |
| 4,924,276 | 5/1990 | Heime | 257/99 |
| 4,951,098 | 8/1990 | Albergo | 357/17 |
| 4,956,684 | 9/1990 | Urata | 357/17 |
| 4,984,035 | 1/1991 | Kanazawa | 357/17 |
| 5,077,587 | 12/1991 | Albergo et al. | 257/98 |
| 5,250,820 | 10/1993 | Sawase et al. | 257/99 |

FOREIGN PATENT DOCUMENTS

2305482 12/1990 Japan .
381164 4/1991 Japan .

Primary Examiner—Ngân V. Ngô
Assistant Examiner—Stephen D. Meier
Attorney, Agent, or Firm—Fish & Richardson

[57] ABSTRACT

An LED array in which the optical output distribution in each light emitting region is as uniform as possible. An n electrode 3 is provided on the under surface of a substrate 2 and a p electrode is provided on the upper surface thereof. A multiplicity of light emitting regions 4 are formed on the upper layer of the substrate 2. Two strip-like conductor portions 6c extending over each light emitting region 4 in ohmic contact are connected to each electrode 6 so that a current is efficiently applied to the conductor portions 6c of each light emitting region 4 and the optical output distribution in each light emitting region 4 is made uniform.

20 Claims, 6 Drawing Sheets

LIGHT EMITTING DIODE AND LIGHT EMITTING DIODE ARRAY HAVING UNIFORM LIGHT DISTRIBUTION

This application is a continuation of U.S. application Ser. No. 07/828,141, filed Jan. 30, 1992, now U.S. Patent No. 5,250,820.

BACKGROUND OF THE INVENTION

1. Field of the Invention

The present invention relates to a light emitting diode and, more particularly, to the improvement in the optical output distribution in a light emitting diode array which is used for photoprinters and the like.

2. Description of the Related Art

As a light emitting diode (hereinunder referred to as "LED") array with an improved optical output distribution, one having the structure shown in FIG. 7 is well known. The LED array is composed of a substrate 52, light emitting regions 54, an electrode 53, individual electrodes 56, etc. The substrate 52 has a two-layer structure having, for example, an n-type GaAsP 52a layer on the upper side and, for example, an n-type GaAs layer 52b on the lower side. On the under surface of the substrate 52 is provided the electrode 53 made of a gold (Au) alloy or the like.

On the upper surface of the substrate 52 (layer 52a), a multiplicity of light emitting regions 54 made of p-type diffusion layers are arranged at regular intervals. An insulation layer 55 is formed over the upper surface of the substrate 52 except at the light emitting regions 54 so as to insulate the upper surface of the substrate 52. On the insulation layer 55, a multiplicity of separate electrodes 56 made of Al or the like are provided. As shown in FIG. 8, one strip-like conductor portion 56c is connected to the end portion of each of the separate electrodes 56 in such a manner that the conductor portion 56c extends over the light emitting region 54 until the end portion 56b thereof reaches the insulation layer 55.

The LED array shown in FIG. 7 is obtained by improving an LED array in which ohmic contact is established only between the end portion 56b of the separate electrode 56 and the end portion of the light emitting region 54. Since the conductor portion 56c transverses the light emitting region 54 in the direction of the Y-axis, the current density in the light emitting region 54 as a diffusion layer is made uniform, but it is still insufficient for realizing high-quality printing by a photoprinter. In other words, in an LED array each LED provided with one strip-like conductor portion 56c (especially, an LED array having a low dot density), the distribution of the emission intensity in the direction Xc (in the transverse direction of the light emitting region 54 of the each LED) shown in FIG. 5(c) becomes non-uniform, as indicated by the fine dot line in FIG. 5 (d).

This is because it is difficult to efficiently apply a current from the conductor portion 56c which is situated above the light emitting region 54 to both ends of the light emitting region 54. As a result, the gradient of the emission intensity indicated by the dotted line Xc in FIG. 5(d) becomes gentle at the portions closer to both ends of the light emitting region 54. Therefore, the width of a dot d printed by a photoprinter with the emission intensity characteristic of Xc is narrower in the direction of Y.

To solve this problem, the ratio b/a of the width a of the light emitting region 54 and the width b of the conductor portion 56c in FIG. 8 may be increased, but if the dimension of b is too large, a part of the printed dot is deficient (blank). It is therefore difficult to optimize the ratio b/a to make the emission intensity uniform.

SUMMARY OF THE INVENTION

Accordingly, it is an object of the present invention to eliminate the above-described problems in the related art and to provide a light emitting diode and a light emitting diode array in which the optical output distribution in each light emitting region is as uniform as possible.

To achieve this aim, the present invention provides a light emitting diode comprising a substrate, a light emitting region provided on the substrate, an electrode for supplying a current to the light emitting region, and a plurality of strip-like conductor portions which are connected to the end portion of the electrode and extend over the light emitting region so as to establish ohmic contact and supply a current to the light emitting region.

The present invention also provides a light emitting diode comprising a substrate, a light emitting region provided on the substrate, an electrode for supplying a current to the light emitting region, a plurality of strip-like conductor portions which are connected to the end portion of the electrode and extend over the light emitting region so as to establish ohmic contact and supply a current to the light emitting region, and a non-light-emitting region provided approximately at the central portion of the of the light emitting region which is defined by the plurality of strip-like conductor portions.

The present invention also provides a light emitting diode array composed of a plurality of the above-described light emitting diodes arranged in a predetermined pattern.

In a light emitting diode and a light emitting diode array according to the present invention, since at least two strip-like conductor portions are provided over the light emitting region, the current density in the light emitting region and, hence, the optical output distribution in the light emitting region is made uniform. In addition, if a non-light-emitting region (i.e., non-diffusion region) is provided in the vicinity of the central portion of the light emitting region between the strip-like conductor portions, the current density is further enhanced so that the optical output per unit area is increased while making the emission intensity distribution uniform.

In the present invention, the number of strip-like conductor portions is at least two and is preferably selected to be in the range which does not deteriorate the printing quality. When the light emitting region is partitioned into small regions by the strip-like conductor portions, all the regions preferably have the same width so as to make the current density uniform. In addition, all the strip-like conductor portions preferably have the same width. In the case of providing a non-light-emitting region in a part of the light emitting region, the area and the shape of the non-light-emitting portion is not specified so long as it does not have deleterious influence on the printing quality.

The above and other objects, features and advantages of the present invention will become clear from the following description of the preferred embodiments thereof, taken in conjunction with the accompanying drawings.

DESCRIPTION OF PREFERRED EMBODIMENTS

An LED array according to the present invention will be explained in detail hereinunder with reference to embodiments.

Figure 1:
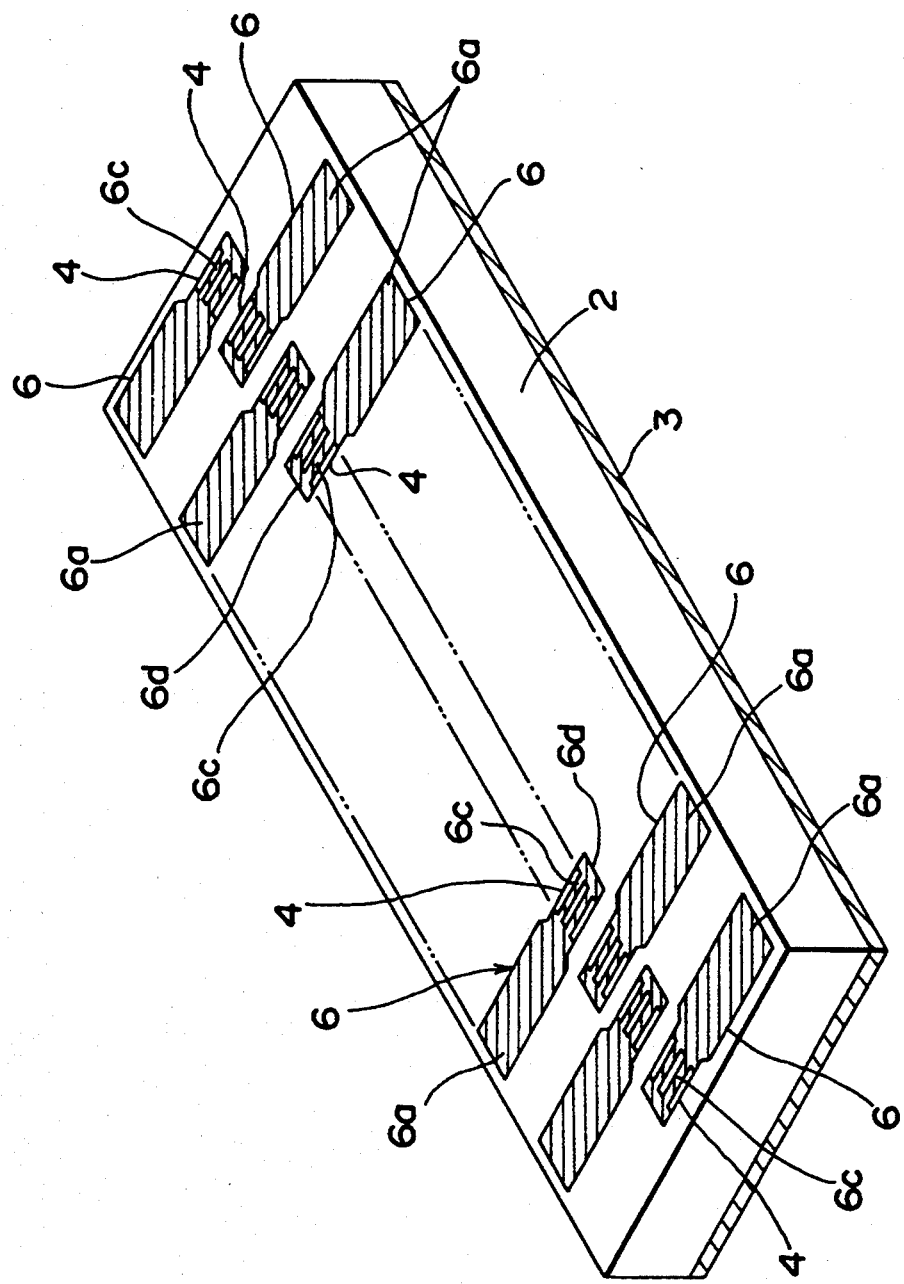
FIG. 1 is a perspective view of the external appearance of an embodiment of an LED array according to the present invention.
Figure 2:
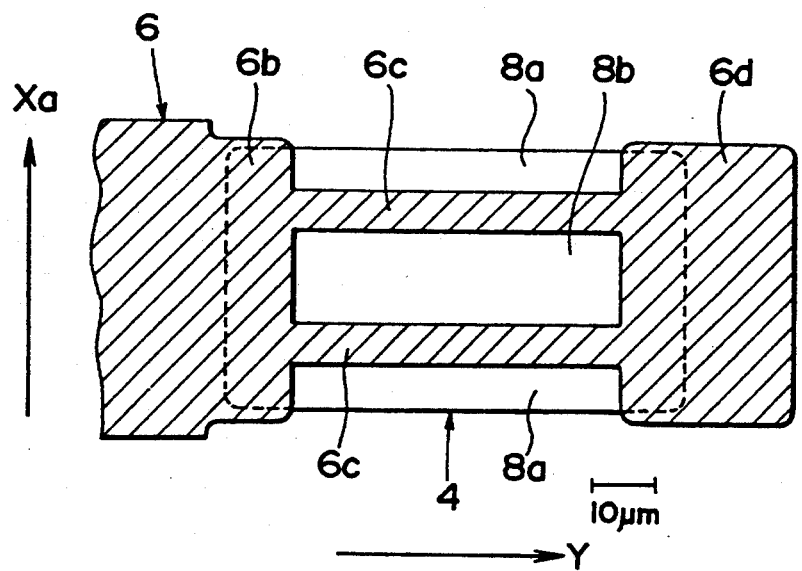
FIG. 2 is a plan view of a strip-like conductor portion of an electrode and a light emitting diode in the LED array shown in FIG. 1.
Figure 4:
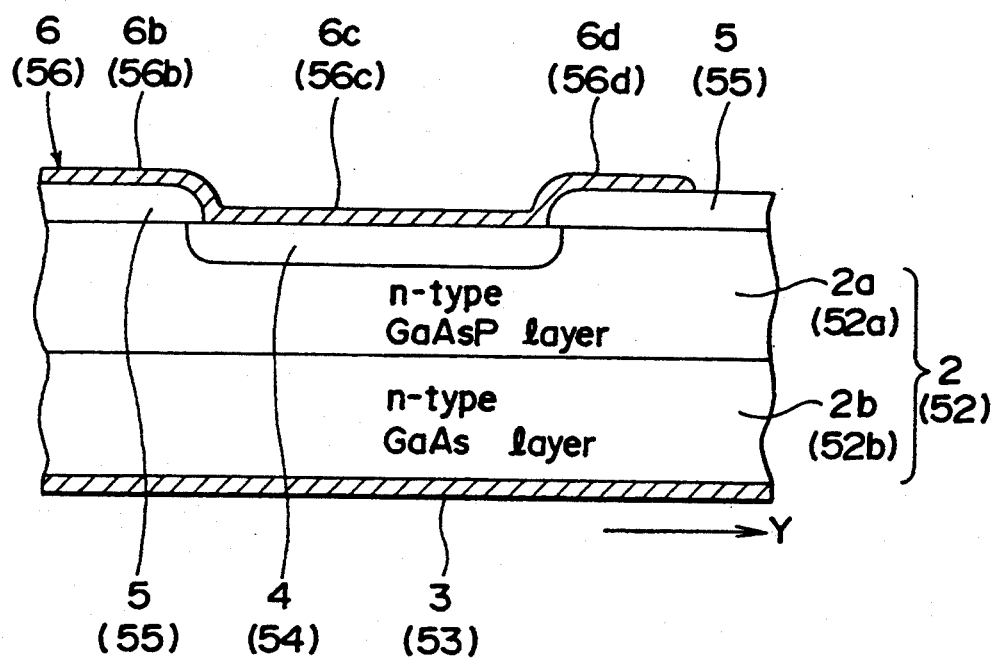
FIG. 4 is a sectional-view of the main part of the LED array shown in FIG. 1.
Figure 7:
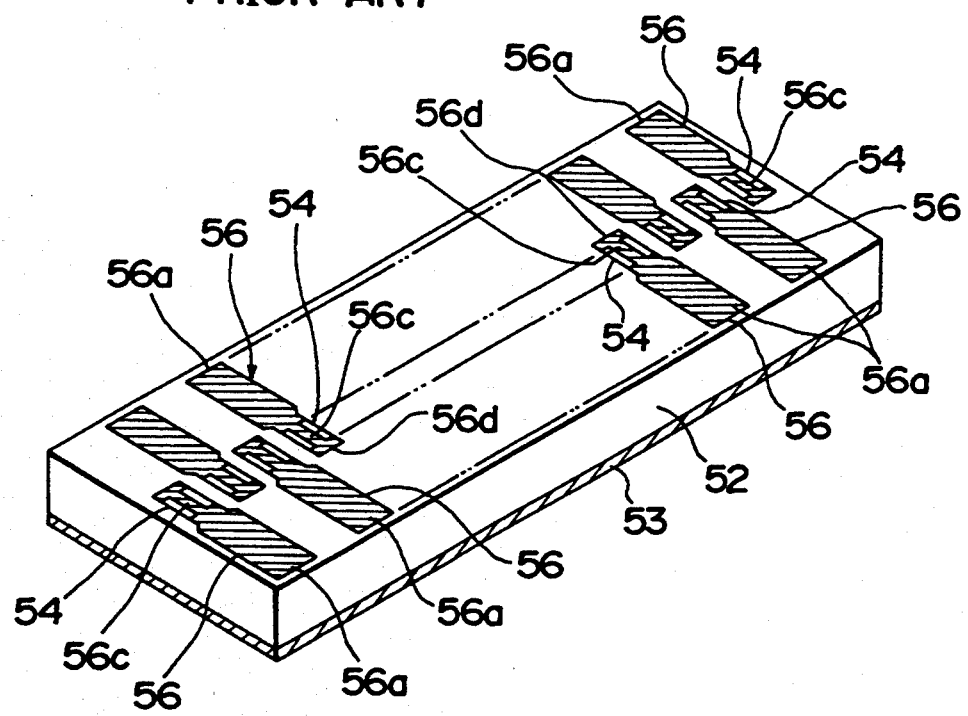
FIG. 7 is a perspective view of the external appearance of a conventional LED array.
Figure 8:
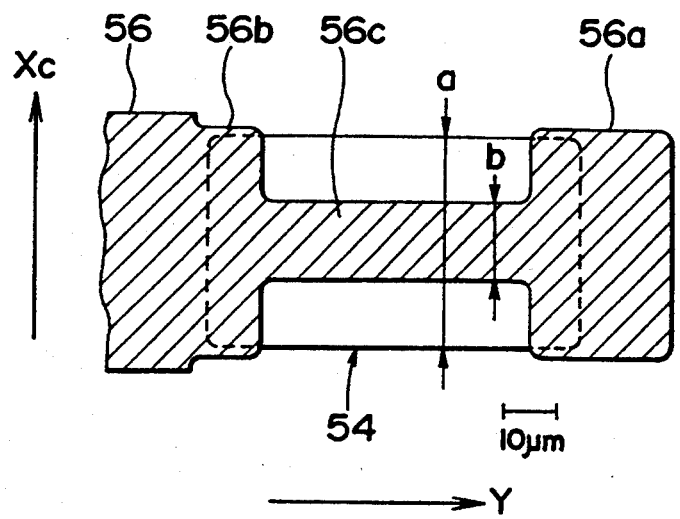
FIG. 8 is a plan view of a strip-like conductor portion of an electrode and a light emitting diode in the LED array shown in FIG. 7.
Figure 9:
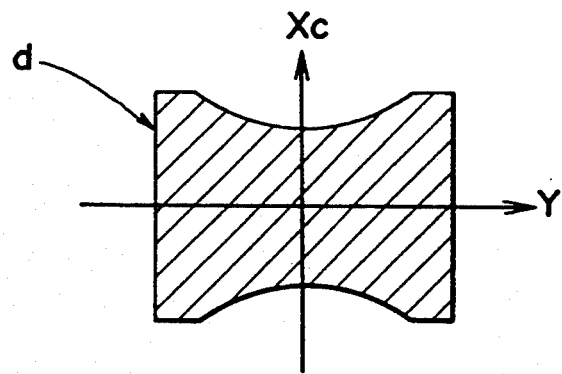
FIG. 9 shows a printed dot obtained by a photoprinter to which a conventional LED array is applied.

An embodiment of an LED array according to the present invention is shown in FIGS. 1 and 2. This embodiment has fundamentally the same structure as the conventional LED array shown in FIG. 7 except for two strip-like conductor portions 6c. A substrate 2 has a two-layer structure having an n-type GaAsP layer 2a on the upper portion and an n-type GaAs layer 2b on the lower portion, as shown in FIG. 4. An n electrode 3 is formed on the under surface of the substrate 2.

A multiplicity of light emitting regions 4 as p-type diffusion layers are arranged on the upper surface of the substrate 2. The depth of each of the light emitting regions is for example 2 μm. An insulation layer 5 is formed over the upper surface of the substrate 2 except at light emitting regions 4 so as to insulate the upper surface of the substrate 2. A p electrode 6 for each light emitting region is provided on the insulation layer 5 and one end portion 6a of each electrode 6 reaches the edge portion of the upper surface of the substrate 2.

As shown in FIG. 2, from the other end portion 6b of each electrode 6 the two strip-like conductor portions 6c are extended over the light emitting region 4 in the direction of the Y-axis in such a manner as to partition the light emitting region 4 into three portions. The two conductor portions 6c are parallel to each other and the end portions 6d of the conductor portions 6c have an enlarged width. The two conductor portions 6c have the same width. The light emitting region 4 is partitioned into three portions by the conductor portions 6c so that the ratio of the width of the side portions 8a to the width of the central portion 8b is 1:2.

Figure 5A:
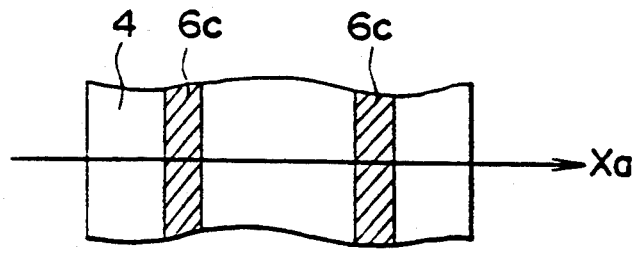
FIGS. 5(a)–5(d) is an explanatory view of the relationship between the strip-like conductor portion of an electrode and the light emitting region and the optical output in the direction of the X-axis.
Figure 5B:
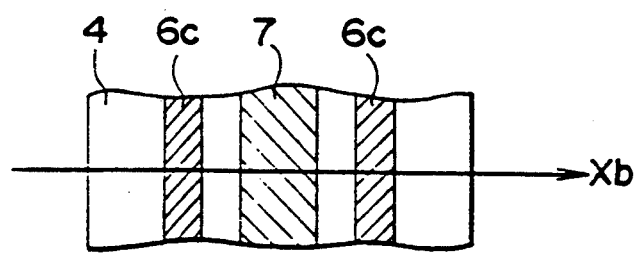
Figure 5C:
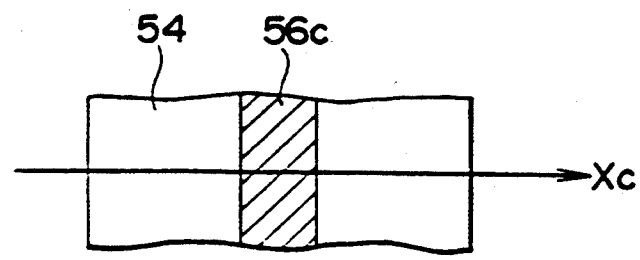
Figure 5D:
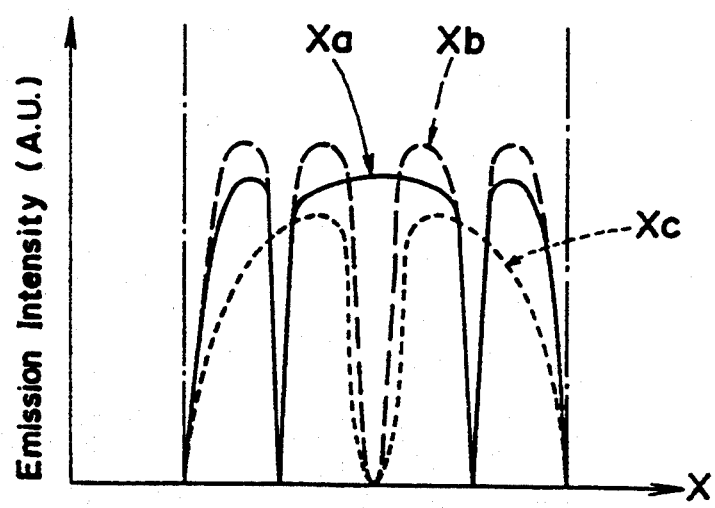
Figure 6:
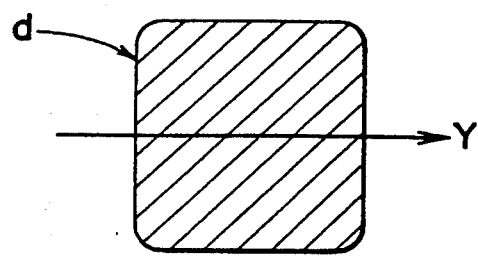
FIG. 6 shows a printed dot obtained by a photoprinter to which an LED array according to the present invention is applied.

In the LED array of this embodiment, since a current is uniformly supplied from the two strip-like conductor portions 6c to the light emitting region 4 and the current density is made uniform, the emission intensity distribution in the direction of Xa is also made considerably uniform. Referring to FIG. 5, in the light emitting region 4 provided with the two strip-like conductor portions 6c, the distribution of the optical output distribution in the direction of the Xa-axis in FIG. 5(a) is represented by the solid line Xa in FIG. 5(d). As is obvious from this graph, not only is the gradient of the solid line Xa sharper than the gradient of the fine dotted line Xc, which represents the optical output distribution in the conventional light emitting region 54 provided with only one strip-like conductor portion 56c [see FIG. 5(c)], but also the output level is increased. As a result, the printed dot d has a distinct rectangular shape, as shown in FIG. 6, and high-quality printing is achieved.

Figure 3:
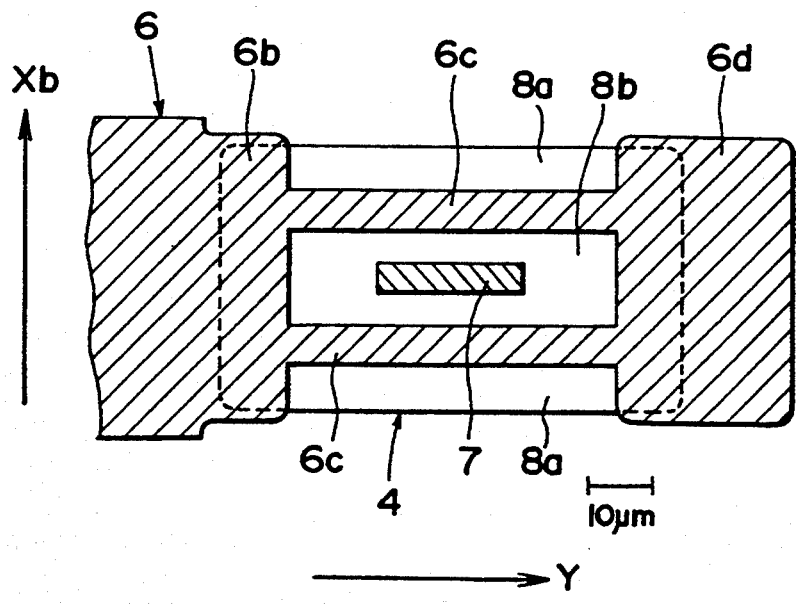
FIG. 3 is a plan view of a modification of a strip-like conductor portion of an electrode and a light emitting diode in the LED array shown in FIG. 1.

Another embodiment is shown in FIG. 3. This embodiment is characterized by the fact that a rectangular non-light-emitting region 7 is provided in the vicinity of the central portion of the region 8b between the two strip-like conductor portions 6c. The non-light-emitting region 7 is formed by masking the corresponding region when the light emitting region 4 as a diffusion layer is provided on the upper surface of the upper layer 2a of the substrate 2.

In this LED array, the current applying efficiency from the conductor portions 6c to the light emitting region 4 is further enhanced and the current density is increased. The optical output distribution in the direction of the Xb-axis shown in FIG. 5(b) is represented by the thick dotted line Xb in FIG. 5(d). As is clear from this graph, not only is the gradient of the thick dotted line Xb even sharper than the gradient of the solid line Xa, which represents the optical output distribution in the first embodiment, but also the emission intensity is further enhanced. As a result, the printing quality is further improved.

Although the above embodiments of an LED array are of diffusion type, the present invention is not restricted thereto and is also applicable to a mesa etching type LED array.

In an LED array of the present invention, since at least two strip-like conductor portions are provided on the light emitting region, a current is applied from the electrode to the light emitting region with good efficiency and the optical output distribution in the light emitting region is made uniform. Accordingly, if an LED array of the present invention is applied to a photoprinter, high-quality printing is achieved.

In addition, if a non-light-emitting region is provided in the vicinity of the light emitting region between the strip-like conductor portions, the current density is further increased and the emission intensity per unit area is also increased, so that the printing quality is further improved.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A light emitting diode having uniform light distribution, said light emitting diode comprising:
   a substrate having a semiconductor layer of a first conduction type;
   a light emitting region of a second conduction type diffused on said semiconductor layer, said light emitting region and said semiconductor layer forming a P-N junction for emitting light in a direction substantially vertical thereto;

an insulation layer formed on a portion of said semiconductor layer;

an electrode disposed on said insulation layer, adjacent to said light emitting region; and at least two strip-like conductor portions, each including a first conductor end portion, said strip-like conductor portions being parallel to one another at a predetermined spacing and being connected to said electrode at said first conductor end portions such that said strip-like conductor portions extend over said light emitting region to establish ohmic contact with said light emitting region and to divide said light emitting region into a plurality of light emitting areas, wherein a current is supplied to said light emitting areas from said electrode via said strip-like conductor portions so that said light emitting areas emit light uniformly.

2. A light emitting diode as claimed in claim 1, wherein said insulation layer is not formed on said light emitting region.

3. A light emitting diode array having uniform light distribution, said light emitting diode array comprising:
a plurality of light emitting diodes as claimed in claim 2, wherein said plurality of light emitting diodes are arranged in a predetermined pattern.

4. A light emitting diode as claimed in claim 1, wherein said strip-like conductor portions are substantially equal in width.

5. A light emitting diode array having uniform light distribution, said light emitting diode array comprising:
a plurality of light emitting diodes as claimed in claim 4, wherein said plurality of light emitting diodes are arranged in a predetermined pattern.

6. A light emitting diode as claimed in claim 1, wherein each of said light emitting areas includes two area end portions, and wherein
(a) the width of each of said two area end portions, and
(b) the width of said light emitting areas excluding said two area end portions
are substantially in a ratio of 1 to 2.

7. A light emitting diode array having uniform light distribution, said light emitting diode array comprising:
a plurality of light emitting diodes as claimed in claim 6, wherein said plurality of light emitting diodes are arranged in a predetermined pattern.

8. A light emitting diode as claimed in claim 1, wherein said strip-like conductor portions further include second conductor end portions, and wherein said second conductor end portions extend to said insulation layer on a side opposite of said electrode, and where said second conductor end portions are mutually connected in order to form a wide region.

9. A light emitting diode array having uniform light distribution, said light emitting diode array comprising:
a plurality of the light emitting diodes as claimed in claim 8, wherein said plurality of light emitting diodes are arranged in a predetermined pattern.

10. A light emitting diode array having uniform light distribution, said light emitting diode array comprising:
a plurality of light emitting diodes as claimed in claim 1, wherein said plurality of light emitting diodes are arranged in a predetermined pattern.

11. A light emitting diode having uniform light distribution, said light emitting diode comprising:

a substrate having a semiconductor layer of a first conduction type;

a light emitting region of a second conduction type diffused on said semiconductor layer, said light emitting region and said semiconductor layer forming a P-N junction for emitting light in a direction substantially vertical thereto;

an insulation layer formed on a portion of said semiconductor layer;

an electrode disposed on said insulation layer, partially overlapping said light emitting region; and at least two strip-like conductor portions, each including a first conductor end portion, said strip-like conductor portions being parallel to one another at a predetermined spacing and being connected to said electrode at said first conductor end portions such that said strip-like conductor portions extend over said light emitting region to establish ohmic contact with said light emitting region and to divide said light emitting region into a plurality of light emitting areas, wherein a current is supplied to said light emitting areas from said electrode via said strip-like conductor portions so that said light emitting areas emit light uniformly.

12. A light emitting diode as claimed in claim 11, wherein said insulation layer is not formed on said light emitting region.

13. A light emitting diode array having uniform light distribution, said light emitting diode array comprising:
a plurality of light emitting diodes as claimed in claim 12, wherein said plurality of light emitting diodes are arranged in a predetermined pattern.

14. A light emitting diode as claimed in claim 11, wherein said strip-like conductor portions are substantially equal in width.

15. A light emitting diode array having uniform light distribution, said light emitting diode array comprising:
a plurality of light emitting diodes as claimed in claim 14, wherein said plurality of light emitting diodes are arranged in a predetermined pattern.

16. A light emitting diode as claimed in claim 11, wherein each of said light emitting areas includes two area end portions, and wherein
(a) the width of each of said two area end portions, and
(b) the width of said light emitting areas, excluding said two end portions
are substantially in a ratio of 1 to 2.

17. A light emitting diode array having uniform light distribution, said light emitting diode array comprising:
a plurality of light emitting diodes as claimed in claim 16, wherein said plurality of light emitting diodes are arranged in a predetermined pattern.

18. A light emitting diode as claimed in claim 11, wherein said strip-like conductor portions further include second conductor end portions, and wherein said second conductor end portions extend to said insulation layer on a side opposite of said electrode and where said second conductor end portions are mutually connected to form a wide region.

19. A light emitting diode array having uniform light distribution, said light emitting diode array comprising:
a plurality of light emitting diodes as claimed in claim 18, wherein said plurality of light emitting diodes are arranged in a predetermined pattern.

20. A light emitting diode array having uniform light distribution, said light emitting diode array comprising:
a plurality of light emitting diodes as claimed in claim 11, wherein said plurality of light emitting diodes are arranged in a predetermined pattern.

* * * * *